United States Patent [19]

Rowland, Jr.

[11] Patent Number: 6,125,271
[45] Date of Patent: Sep. 26, 2000

[54] FRONT END FILTER CIRCUITRY FOR A DUAL BAND GSM/DCS CELLULAR PHONE

[75] Inventor: John R. Rowland, Jr., Mission Viejo, Calif.

[73] Assignee: Conexant Systems, Inc., Newport Beach, Calif.

[21] Appl. No.: 09/036,258

[22] Filed: Mar. 6, 1998

[51] Int. Cl.[7] .............................. H04B 1/18; H04B 7/185
[52] U.S. Cl. .............................. 455/313; 455/46; 455/47; 455/202; 455/203; 455/307; 455/32.3; 455/334; 455/553; 329/308
[58] Field of Search .................................... 455/313, 306, 455/307, 323, 334, 273, 293, 311, 326, 305, 260, 552, 553, 202, 203, 45–47; 329/308

[56] References Cited

U.S. PATENT DOCUMENTS

| | | | |
|---|---|---|---|
| 4,485,383 | 11/1984 | Maher | 455/305 |
| 5,179,731 | 1/1993 | Trankle et al. | 455/313 |
| 5,212,825 | 5/1993 | Layton | 455/306 |
| 5,249,138 | 9/1993 | Piety, Jr. et al. | 364/508 |
| 5,293,170 | 3/1994 | Lorenz et al. | 342/352 |
| 5,343,168 | 8/1994 | Guthrie | 455/260 |
| 5,926,751 | 7/1999 | Vlahos et al. | 455/552 |
| 5,966,053 | 10/1999 | Durig et al. | 331/116 |

FOREIGN PATENT DOCUMENTS

| | | | |
|---|---|---|---|
| 0678 974 A2 | 4/1995 | European Pat. Off. | H03D 7/16 |
| 0798 880 A2 | 10/1997 | European Pat. Off. | H04B 7/22 |
| 2310 342 | 8/1997 | United Kingdom | H04B 1/40 |
| WO 99/01933 | 1/1999 | WIPO. | |

OTHER PUBLICATIONS

Preliminary Specification entitled, Image Rejecting Front-End for GSM Applications, UAA2073M, by Philips Semiconductors, Jul. 7, 1995, pp. 226–236.

Preliminary Specification entitled, SA1920 PCS/Cellular Dual–Band RF Front–End, by Philips Semiconductors, Aug. 1, 1997.

UHF Technology For The Cordless Revolution, 8140 Electronics World + Wireless World 99 (1993) Jul., No. 1688, Sutton, Surrey, GB.

*Primary Examiner*—Lee Nguyen
*Assistant Examiner*—Simon Nguyen
*Attorney, Agent, or Firm*—Price, Gess & Ubell

[57] ABSTRACT

A front end circuit for an RF dual band GSM/DCS phone includes a first channel including an elliptical high-pass filter, a first SAW filter, and a low noise amplifier and a second channel including a second SAW filter and a second low noise amplifier. The output of each channel is alternately switchable to a single-side band mixer circuit. This front end circuit arrangement provides significantly reduced cost and part count over other approaches.

25 Claims, 4 Drawing Sheets

FRONT END FILTER CIRCUITRY FOR A DUAL BAND GSM/DCS CELLULAR PHONE

BACKGROUND OF THE INVENTION

1. Field of the Invention

The subject invention relates generally to RF systems and more particularly to an improved front end filter configuration for radio circuits such as those employed in cellular telephones.

2. Description of Related Art

Proposed down-conversion dual band GSM/DCS cellular telephone systems employ a front end configuration including a double side band mixer and four filters at a cost of two dollars per filter. The cost of these filters is significant when considering that unit production can be on the order of a million per year or more.

OBJECTS AND SUMMARY OF THE INVENTION

It is therefore an object of the invention to improve RF systems;

It is another object of the invention to improve front end filter circuitry in an RF receiver; and It is still another object of the invention to reduce the component count, space requirements and cost of front end filter circuitry in GSM/DCS phone systems.

These and other objects and advantages are achieved according to the invention by employing a high-pass filter and SAW filter for the DCS channel together with a single-side band (SSB) mixer. Use of the single-side band mixer results in elimination of two filters required according to other proposed approaches. The elimination of these two filters reduces the space needed for the circuitry, as well as the cost of the phone. The high-pass filter provides additional suppression of the side band frequency of the SSB mixer, without which such mixer could not be used.

In one embodiment according to the invention, the high-pass filter was a fifth order elliptical high-pass filter, providing 20 dB of rejection at the image frequency. This image frequency is 800 MHz below the DCS band of 1805 to 1880 MHz (1005 to 1080 MHz). Thus, the circuitry meets the spurious rejection requirements down in the GSM specifications. Implementation of the preferred embodiment results in cost reductions over other proposed solutions.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide a particularly high performance and low cost front end filter circuit for dual band phone applications.

Figure 1:
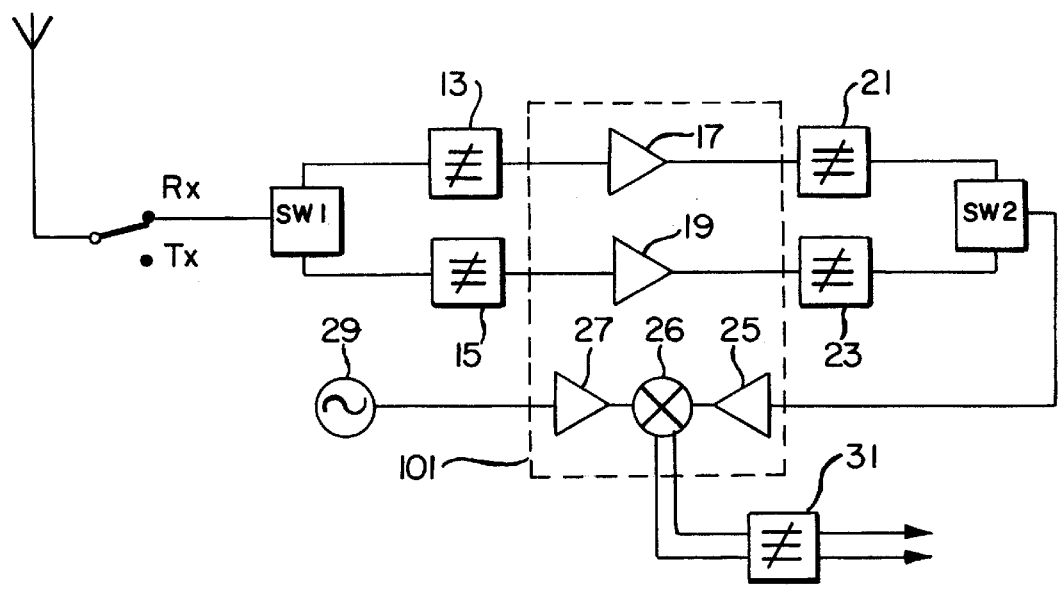
FIG. 1 is a circuit schematic diagram illustrating proposed dual band phone front end filter circuitry.

A proposed DCS/GSM dual band phone front end circuit is illustrated in FIG. 1. As is shown, the received signal from an antenna 12 is switchable via a switch or splitter SW1 between respective first and second SAW filters 13, 15. The first SAW filter 13 has a bandwidth of 1805 to 1880 MHz and outputs to a first low noise amplifier (LNA) 17, while the second SAW filter 15 has a bandwidth of 935 to 960 MHz and outputs to a second low noise amplifier 19. The outputs of the respective amplifiers 17, 19 are connected to third and fourth filters 21, 23, having respective bandwidths of 1805 to 1880 MHz and 935 to 960 MHz. The output of one of the third and fourth filters 21, 23 is supplied via a switch or combiner SW2 to an amplifier 25 and then to a double-side band mixer 26. The double-side band mixer 26 receives a second input from a local oscillator 29 supplied through an amplifier 27 and outputs to an IF filter 31. The output of the filter 31 is then supplied to the remainder of the dual band phone circuit. The componentry within the dotted line 101 of FIG. 1 may comprise a commercially available part such as No. TQ9222 as manufactured by Triquint Semiconductor, Inc., Hillsboro, Oreg.

Figure 2:
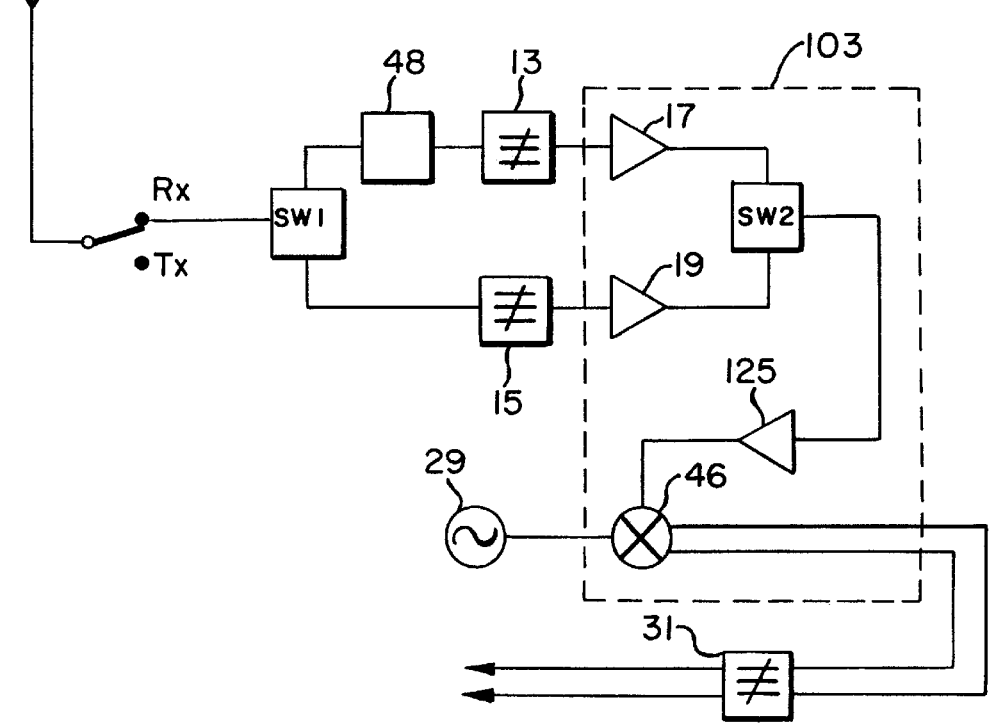
FIG. 2 is a circuit schematic diagram of a dual band phone front end circuit according to the preferred embodiment.

The improved front end circuitry according to the preferred embodiment is illustrated in FIG. 2. In this circuitry, the output of the respective low noise amplifiers 17, 19 are connected directly to the input of an amplifier 125 whose output is connected to one input of a single-side band mixer circuit 46. The single-side band mixer circuit 46 receives the output of a local oscillator 29 as its second input and again outputs to the IF filter 31. In addition, a high-pass filter 48 is inserted in the signal path between the switch SW1 and the SAW filter 13. The circuit within the dotted line 103 of FIG. 2 may comprise Rockwell Part No. RF210.

Figure 3:
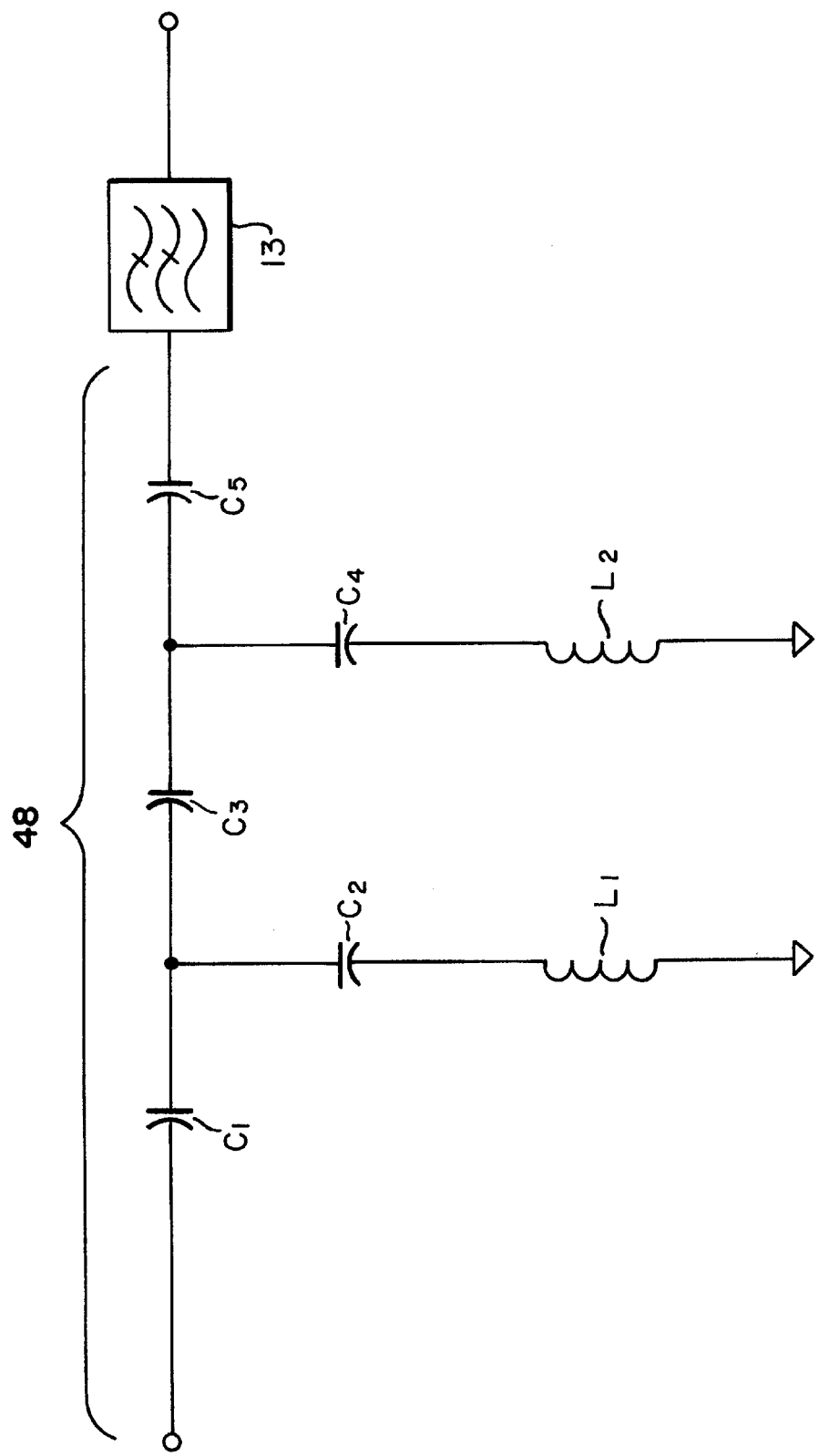
FIG. 3 is a circuit schematic of an elliptical filter useful in the preferred embodiment.

The preferred high-pass filter 48 is a fifth order elliptical high-pass filter as shown in FIG. 3. In the circuit of FIG. 3, the second terminal of a capacitor $C_1$ is connected to the respective first terminals of a capacitor $C_2$ and a capacitor $C_3$. The second terminal of the capacitor $C_2$ is connected to the first terminal of an inductor $L_1$, whose second terminal is grounded. The second terminal of the capacitor $C_3$ is connected to the first terminal of a capacitor $C_4$ and to the first terminal of a capacitor $C_5$. The second terminal of the capacitor $C_4$ is connected to the first terminal of a second inductor $L_2$ whose second terminal is grounded. The second terminal of the capacitor $C_5$ is connected to the first input of the SAW filter 13.

Typical component values for the high-pass filter circuit 48 of FIG. 3 are as follows:

| | |
|---|---|
| $C_1$ | 2.7 pF |
| $C_2$ | 5.6 pF |
| $C_3$ | 1.8 pF |
| $C_4$ | 3.3 pF |

-continued

| | |
|---|---|
| $C_S$ | 3.3 pF |
| $L_1$ | 4.7 nH |
| $L_2$ | 4.7 nH |

Figure 4:
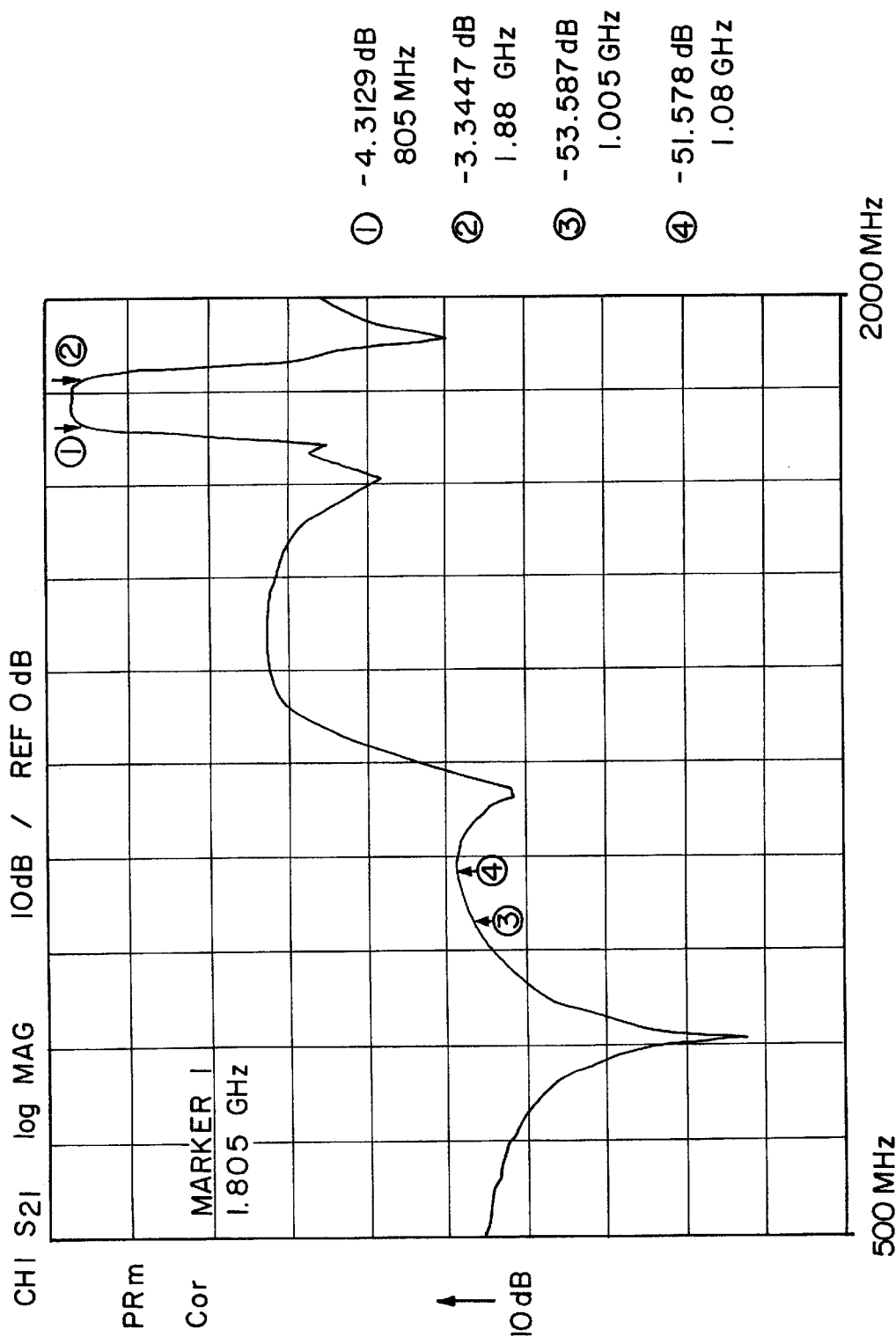
FIG. 4 is a graph to scale illustrating an exemplary filter characteristic of a high-pass filter and SAW filter combination constructed according to FIG. 3.

A filter characteristic for a prototype of the filter circuitry (high-pass 48 plus SAW 13) of FIG. 3 is illustrated in FIG. 4 where the vertical axis is marked in 10 dB increments and the horizontal axis starts at 0.5 GHz and extends at 0.15 GHz increments to 2 GHz. As may be seen, the filter characteristic exhibits a well defined pass-band between 1805 and 1880 MHz and provides 51.578 dB and 53.587 dB total rejection at 108 GHz and 1.005 GHz (points 3 and 4), respectively. Such rejection is required to meet specifications in conjunction with the single-side band mixer.

In the embodiment of FIG. 2, the SAW filters 13, 15 may comprise commercially available parts such as FUJITSU Part No. FAR F6CE1G8425L2YB and Part No. FAR F5CH947M50-L2EV, respectively.

second phase shifter 137 and summed with the output of the second mixer of 135 to form the IF signal for supply to the IF filter 31.

Figure 5:
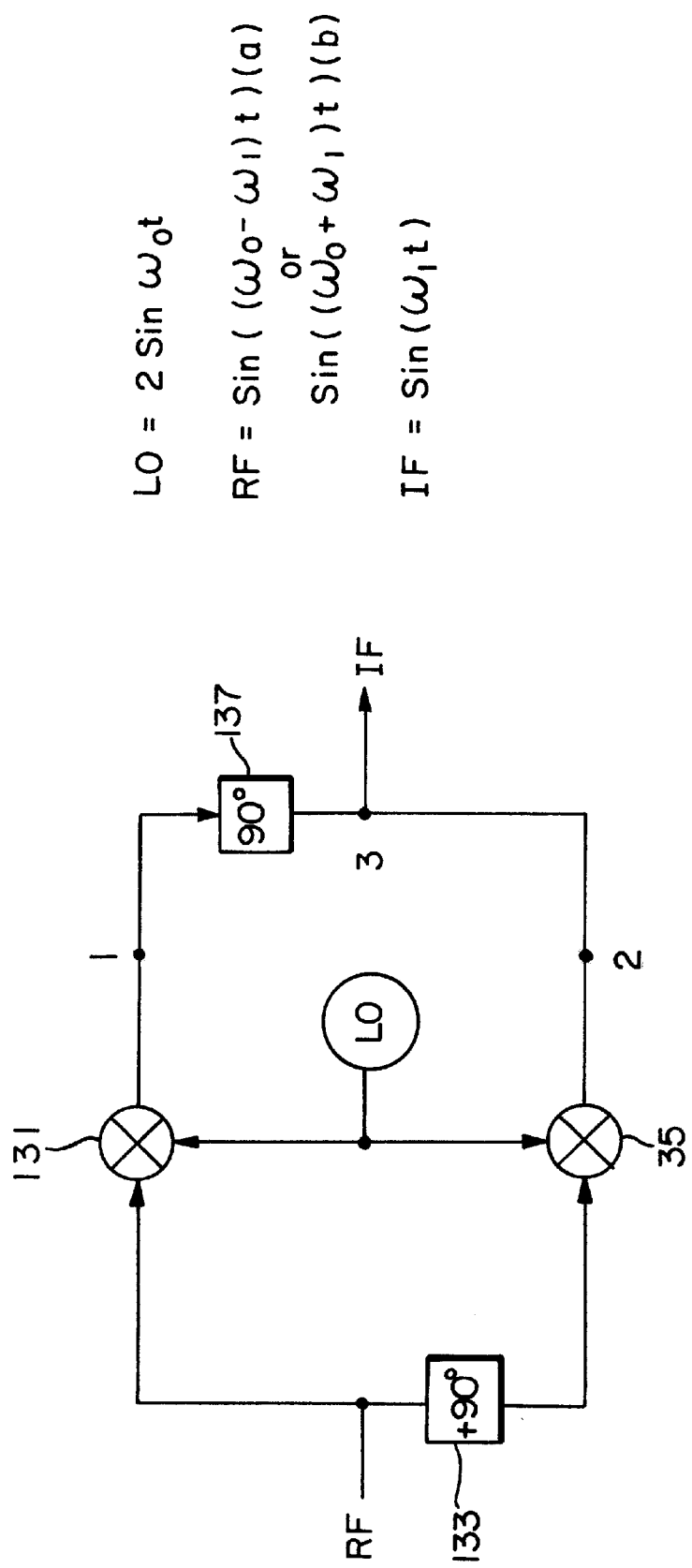
FIG. 5 is a circuit schematic illustrating a single-side band mixer circuit.

The SSB mixer shown in FIG. 5 suppresses the lower side band (LO frequency minus the IF frequency) and is suitable for the DCS channel. In contrast, a double side band mixer (the conventional type) produces an IF frequency whenever the RF port is presented with either the (LO frequency+the IF frequency) or the (LO frequency−the IF frequency).

A similar SSB mixer circuit is used to produce the IF signal for the GSM mode. Such a circuit may employ the two mixers 131, 133 of FIG. 5 with an appropriate local oscillator frequency and different phase shifts switched-in at appropriate points in the circuit. Such "switching-in" may be accomplished, for example, by on-chip switches responsive to a microcontroller signal indicating GSM or DCS frequency mode. As those skilled in the art will appreciate, various other SSB mixer configurations may be used for the DCS or GSM modes, for example, with phase shifters located at other points in the circuit.

In summary, according to the above preferred embodiment, a high-pass filter 48 is added to the input of the

| Part number: FAR-F6CE-1G8425-L2YB | | | | | | | |
|---|---|---|---|---|---|---|---|
| | | | | Rating | | | |
| Item | Symbol | Condition | Min. | Typ. | Max. | Unit | Remarks |
| Insertion Loss | I L | 1805–1880 MHz | — | 3.3 | 4.5 | dB | |
| Inband Ripple | | 1805–1880 MHz | — | 1.5 | 2.5 | dB | |
| Absolute Attenuation | | DC–1500 MHz | 20 | 22 | — | dB | |
| | | 1600–1710 MHz | 22 | 24 | — | dB | |
| | | 1710–1785 MHz | 10 | 29 | — | dB | |
| | | 1920–2400 MHz | 25 | 27 | — | dB | |
| | | 3610–3760 MHz | 25 | 35 | — | dB | |
| | | 5415–5640 MHz | 15 | 21 | — | dB | |
| Inband VSWR | | 1805–1880 MHz | — | 2.5 | 3.0 | — | |
| Input Power | P IN | 1805–1880 MHz | — | — | 20 | mW | |

| GSM/NMT (Rx) HIGH ATTENUATION TYPE Part number FAR-F5CH-947M50-L2EV | | | | | | | |
|---|---|---|---|---|---|---|---|
| | | | | Rating | | | |
| Item | Symbol | Condition | Min. | Typ. | Max. | Unit | Remarks |
| Insertion Loss | I L | 935–960 MHz | — | 2.8 | 3.5 | dB | |
| Inband Ripple | | 935–960 MHz | — | 1.0 | 2.0 | dB | |
| Absolute Attenuation | | DC–770 MHz | 32 | 34 | — | dB | |
| | | 770–855 MHz | 35 | 38 | — | dB | |
| | | 855–871 MHz | 40 | 43 | — | dB | |
| | | 890–915 MHz | 20 | 30 | — | dB | |
| | | 980–1025 MHz | 15 | 25 | — | dB | |
| | | 1025–1077 MHz | 40 | 46 | — | dB | |
| | | 1077–1105 MHz | 43.5 | 47 | — | dB | |
| | | 1105–2000 MHz | 25 | 30 | — | dB | |
| | | 2000–3000 MHz | 10 | 12 | — | dB | |
| Inband VSWR | | 935–960 MHz | — | 1.6 | 2.0 | — | |

FIG. 5 particularly illustrates a single side-band mixer circuit 46 as employed in the preferred embodiment for the DCS mode. As illustrated, the radio frequency signal RF is supplied to a first mixer 131 and to a phase shifter circuit 133. The phase shifter 133 shifts the signal RF by a positive (+) 90 degrees and supplies the phase shifted signal to a second mixer 135. Each of the first and second mixers receive a second input from a local oscillator LO. The output of the first mixer 131 is phase shifted by 90 degrees by a SAW filter 13, together with a single-side band mixer circuit 46. Thus, the filters 21, 23 of the circuitry illustrated in FIG. 1 are entirely eliminated. Cost is saved and size is reduced. The high-pass filter 48 is necessary to meet the frequency rejection specifications set forth in the GSM/DCS standard given the frequency rejection (side-band suppression) limitations of the single-side band mixer circuit 46 at the image frequency of 1.005 GHz. Without the high-pass filter 48, the standard could not be met because no SAW filter currently manufactured will satisfy the image rejection requirements.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A radio frequency circuit comprising:
   a high-pass filter receiving an RF signal;
   a first SAW filter having an input connected to the high-pass filter;
   a first amplifier connected to the output of the first SAW filter;
   a second SAW filter receiving an RF signal;
   a second amplifier connected to the output of the second SAW filter;
   a combiner for combining the outputs of the first and second amplifier to form an output signal; and
   a single side band mixer having an input connected to the combiner to receive the output signal.

2. The circuit of claim 1 wherein the high-pass filter compensates for insufficient side-band suppression by the single-side band mixer.

3. The circuit of claim 2 wherein the combination of the high-pass filter and the first SAW filter provides total rejection of 54 dB at 1.005 GHz and 52 dB at 1.08 GHz.

4. The circuit of claim 2 wherein the combination of the high-pass filter and the first SAW filter provides total rejection of 50 dB or more at 1.005 GHz and 50 dB or more at 1.08 GHz.

5. The circuit of claim 1 wherein the combination of the high-pass filter and the first SAW filter defines a frequency pass band between 1805 and 1880 MHz.

6. The circuit of claim 5 wherein the combination of the high-pass filter and the first SAW filter provides total rejection of 54 dB at 1.005 GHz and 52 dB at 1.08 GHz.

7. The circuit of claim 5 wherein the combination of the high-pass filter and the first SAW filter provides total rejection of 50 or more dB at 1.005 GHz and 50 dB or more at 1.08 GHz.

8. The circuit of claim 1, wherein the second SAW filter has a frequency pass band between 935 and 960 MHz.

9. The circuit of claim 8 wherein the high-pass filter is an elliptical high-pass filter.

10. The circuit of claim 1 wherein the high-pass filter is an elliptical high-pass filter.

11. The circuit of claim 1 wherein the combination of the high-pass filter and the first SAW filter provides total rejection of 54 dB at 1.005 GHz and 52 dB at 1.08 GHz.

12. The circuit of claim 1 wherein the combination of the high-pass filter and the first SAW filter provides total rejection of 50 dB or more at 1.005 GHz and 50 dB or more at 1.08 GHz.

13. The circuit of claim 1 further including a switch for alternately connecting an antenna to the input of the high-pass filter or the second SAW filter.

14. The circuit of claim 1 wherein the single-side band mixer suppresses a lower side band frequency component consisting of a local oscillator frequency minus an intermediate (IF) frequency.

15. The circuit of claim 1 wherein the single-side band mixer comprises first and second mixer circuits interconnected with first and second phase shifter circuits.

16. A front end radio frequency receiver comprising:
    a high-pass filter;
    a first SAW filter having an input connected to the high-pass filter; and
    a mixer having an input connected to the output of the first SAW filter, wherein the mixer suppresses a frequency component consisting of a local oscillator frequency minus an IF frequency, and the high-pass filter provides compensation for insufficient side band suppression by the mixer.

17. The receiver of claim 16 wherein the combination of the high-pass filter and the first SAW filter defines a frequency pass band between 1805 and 1880 MHz.

18. The receiver circuit of claim 16 wherein the high-pass filter is an elliptical high-pass filter.

19. The receiver circuit of claim 16 wherein the side band suppression is at an image frequency in the range of 1005 to 1080 MHz.

20. The receiver circuit of claim 16 wherein the combination of the high-pass filter and the first SAW filter provides total rejection of 54 dB at 1.005 GHz and 52 dB at 1.08 GHz.

21. The receiver of claim 16 wherein the combination of the high-pass filter and the first SAW filter provides total rejection of 50 dB or more at 1.005 GHz and 50 dB or more at 1.08 GHz.

22. A method for down-converting a dual band radio frequency (RF) signal comprising the steps of:
    filtering a first RF signal with a high-pass filter and a first SAW filter;
    filtering a second RF signal with a second SAW filter;
    amplifying the first and second RF signal;
    combining the first and second RF signal to form an output signal; and
    mixing the output signal and a local oscillator signal with a single-side band mixer.

23. The method of claim 22 wherein the filtering step for the first RF signal further comprises the step of compensating for insufficient side-band suppression by the single-side band mixer.

24. The method of claim 22 wherein the mixing step further comprises the step of suppressing a lower side band frequency component of a local oscillator frequency minus an intermediate (IF) frequency.

25. A method for down-converting a dual band radio frequency (RF) signal in a DCS frequency channel comprising the steps of:
    filtering an RF signal with a high-pass filter and a first SAW filter;
    providing compensation for insufficient side band suppression in the RF signal; and
    mixing the RF signal and a local oscillator signal with a single-side band mixer, wherein the mixing step further comprises the step of suppressing a frequency component consisting of a local oscillator frequency minus an IF frequency.

* * * * *

UNITED STATES PATENT AND TRADEMARK OFFICE
CERTIFICATE OF CORRECTION

PATENT NO. : 6,125,271  
DATED : September 26, 2000  
INVENTOR(S) : Rowland, Jr.

Page 1 of 2

It is certified that error appears in the above-identified patent and that said Letters Patent is hereby corrected as shown below:

Please replace FIG. 4 with the drawing below.

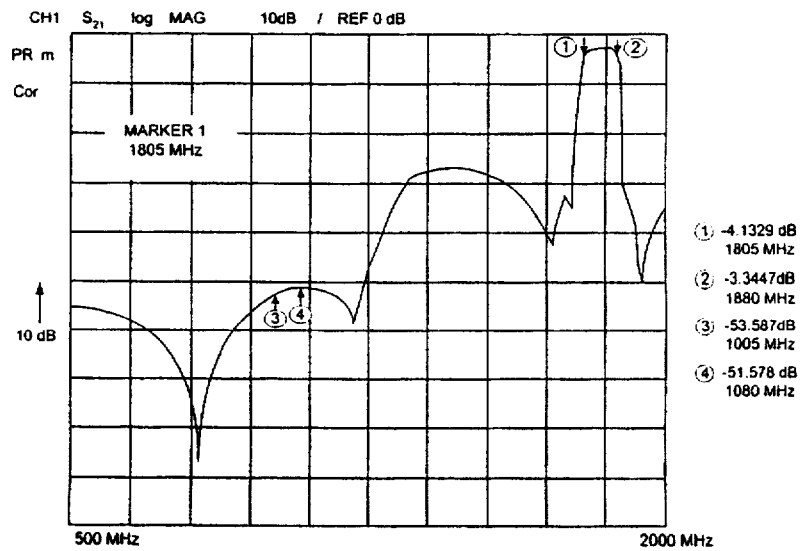

FIG. 4

UNITED STATES PATENT AND TRADEMARK OFFICE
CERTIFICATE OF CORRECTION

PATENT NO.    : 6,125,271
DATED         : September 26, 2000
INVENTOR(S)   : Rowland, Jr.

It is certified that error appears in the above-identified patent and that said Letters Patent is hereby corrected as shown below:

Column 3,
Lines 12-15, after the word "GHz", delete the sentence "As may be seen, the filter characteristic exhibits a well defined pass-band between 1805 and 1880 MHz and provides 51.578 dB and 53.587 dB total rejection at 108 GHz and 1.005 GHz (points 3 and 4), respectively.", and substitute therefor -- As may be seen, the filter characteristic exhibits a well defined pass-band between 1805 and 1880 MHz and provides 53.587 dB and 51.578
dB total rejection at 1005 MHz and 1.080 MHz (points 3 and 4), respectively. --

Column 4,
Line 11, after the numeral "131,", delete the numeral "133", and substitute therefor -- 135 --.

Signed and Sealed this

Thirteenth Day of November, 2001

*Attest:*

NICHOLAS P. GODICI
*Attesting Officer*   Acting Director of the United States Patent and Trademark Office